(12) United States Patent
Tasaki et al.

(10) Patent No.: US 12,091,645 B2
(45) Date of Patent: Sep. 17, 2024

(54) WASHING METHOD, MANUFACTURING METHOD, AND WASHING DEVICE FOR POLYCRYSTALLINE SILICON

(71) Applicant: TOKUYAMA CORPORATION, Yamaguchi (JP)

(72) Inventors: Hiroyuki Tasaki, Yamaguchi (JP); Kazuhiro Kawaguchi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 678 days.

(21) Appl. No.: 17/040,874

(22) PCT Filed: Mar. 25, 2019

(86) PCT No.: PCT/JP2019/012379
§ 371 (c)(1),
(2) Date: Sep. 23, 2020

(87) PCT Pub. No.: WO2019/188912
PCT Pub. Date: Oct. 3, 2019

(65) Prior Publication Data
US 2021/0024858 A1    Jan. 28, 2021

(30) Foreign Application Priority Data
Mar. 27, 2018   (JP) ................. 2018-060772

(51) Int. Cl.
*C11D 7/08*      (2006.01)
*C01B 33/037*    (2006.01)

(52) U.S. Cl.
CPC .............. *C11D 7/08* (2013.01); *C01B 33/037* (2013.01); *C11D 2111/22* (2024.01)

(58) Field of Classification Search
CPC ...... C11D 7/08; C11D 11/0047; C01B 33/037; C01B 33/035; C01P 2002/89; C01P 2006/80; C30B 35/007; C30B 29/06
See application file for complete search history.

(56) References Cited

U.S. PATENT DOCUMENTS

| | | | |
|---|---|---|---|
| 7,905,963 B2 * | 3/2011 | Sakai ................... | C01B 33/037 134/28 |
| 7,922,876 B2 * | 4/2011 | Wochner ............... | C01B 33/037 203/13 |

(Continued)

FOREIGN PATENT DOCUMENTS

| | | | |
|---|---|---|---|
| CN | 101748492 A | | 6/2010 |
| CN | 101974785 A | * | 2/2011 |

(Continued)

OTHER PUBLICATIONS

Zhang, CN-107059136-A, Machine Translation. (Year: 2023).*

(Continued)

*Primary Examiner* — Duy Vu N Deo
*Assistant Examiner* — Christopher Remavege
(74) *Attorney, Agent, or Firm* — Casimir Jones, S.C.; Robert A. Goetz

(57) ABSTRACT

In an embodiment of the present invention, contaminants contained in polycrystalline silicon are removed to obtain highly-pure polycrystalline silicon, with only a small amount of etching. Polycrystalline silicon is washed with use of: a first washing step of bringing fluonitric acid into contact with the polycrystalline silicon; and a second washing step of bringing a non-oxidizing chemical containing hydrofluoric acid into contact with the polycrystalline silicon that has undergone the first washing step.

3 Claims, 2 Drawing Sheets

| FIRST WATER RINSING STEP | FIRST WASHING STEP | SECOND WATER RINSING STEP | SECOND WASHING STEP | THIRD WASHING STEP | THIRD WATER RINSING STEP | DRYING STEP |

FLOW OF STEPS

(56) References Cited

U.S. PATENT DOCUMENTS

| | | | | |
|---|---|---|---|---|
| 8,529,695 B2* | 9/2013 | Harada | ................ | C30B 35/007 |
| | | | | 117/18 |
| 9,073,756 B2* | 7/2015 | Wochner | ................ | C01B 33/021 |
| 9,340,901 B2* | 5/2016 | Schaefer | ................ | B02C 21/00 |
| 9,421,584 B2* | 8/2016 | Wochner | ................ | C01B 33/00 |
| 2010/0132746 A1* | 6/2010 | Sakai | ................ | C01B 33/037 |
| | | | | 134/28 |
| 2011/0048455 A1* | 3/2011 | Atsumi | ................ | C01B 33/037 |
| | | | | 134/135 |
| 2011/0120506 A1* | 5/2011 | Sakai | ................ | C01B 33/037 |
| | | | | 134/84 |
| 2012/0175613 A1* | 7/2012 | Netsu | ................ | C01B 33/035 |
| | | | | 438/500 |
| 2013/0189176 A1* | 7/2013 | Wochner | ................ | C01B 33/037 |
| | | | | 423/348 |
| 2013/0344641 A1* | 12/2013 | Cook | ................ | H01L 31/182 |
| | | | | 438/71 |

FOREIGN PATENT DOCUMENTS

| | | | | | |
|---|---|---|---|---|---|
| CN | 102251242 | A | | 11/2011 | |
| CN | 103151423 | A | | 6/2013 | |
| CN | 103806107 | A | * | 5/2014 | |
| CN | 203900007 | U | | 10/2014 | |
| CN | 104393114 | A | * | 3/2015 | |
| CN | 104752166 | A | | 7/2015 | |
| CN | 107059136 | A | * | 8/2017 | |
| JP | 06-144822 | | | 5/1994 | |
| JP | 2000-239095 | | | 9/2000 | |
| JP | 2006-327838 | | | 12/2006 | |
| JP | 2015-24958 | | | 2/2015 | |
| JP | 5820917 | B2 | * | 11/2015 | ........... C01B 33/037 |
| WO | 2011/033712 | | | 3/2011 | |

OTHER PUBLICATIONS

Liu, CN-104393114-A, Machine Translation. (Year: 2024).*
Zhang, CN-107059136-A, Machine Translation. (Year: 2024).*
Ai, CN-103806107-A, Machine Translation. (Year: 2024).*
Kurosawa, JP-5820917-B2, Machine Translation. (Year: 2024).*
Gao, CN-101974785-A, Machine Translation. (Year: 2024).*
Office Action for CN Patent Application No. 201980021525.4, mailed Mar. 3, 2021, 10 total pages.
International Preliminary Report on Patentability for PCT/JP2019/012379, mailed Sep. 29, 2020, 8 pages.
International Search Report for PCT/JP2019/012379, mailed Jun. 25, 2019, 1 page.

* cited by examiner

WASHING METHOD, MANUFACTURING METHOD, AND WASHING DEVICE FOR POLYCRYSTALLINE SILICON

TECHNICAL FIELD

The present invention relates to a method of washing polycrystalline silicon, a method of producing polycrystalline silicon, and a washing device for polycrystalline silicon.

BACKGROUND ART

Polycrystalline silicon manufactured by e.g. a Siemens process is used in e.g. production of single-crystal silicon used for semiconductors and production of polycrystalline silicon for the solar cells. In particular, highly-pure polycrystalline silicon is required for semiconductor applications. In order to obtain such highly-pure polycrystalline silicon, washing is carried out.

Patent Literature 1 discloses a washing method in which polycrystalline silicon is washed by carrying out (i) a washing treatment with use of hydrofluoric acid, and then (ii) an etching treatment with use of fluonitric acid.

CITATION LIST

Patent Literature

[Patent Literature 1]
Japanese Patent Application Publication Tokukai No. 2006-327838

SUMMARY OF INVENTION

Technical Problem

However, in the techniques disclosed in Patent Literature 1, the amount of etching is increased in order to improve the purity of the polycrystalline silicon. This is problematic in terms of costs.

An aspect of the present invention has been made in view of the above-described problem. An object of the present invention is to obtain highly-pure polycrystalline silicon with only a small amount of etching.

Solution to Problem

As a result of diligent research by the present inventors in order to solve the above problem, it was found that, by combining (i) a first washing step which uses fluonitric acid with (ii) a subsequent second washing step which uses hydrofluoric acid, it is possible to reduce the cost of producing polycrystalline silicon and obtain highly-pure polycrystalline silicon. In other words, the present invention includes the following.

In order to solve the above problem, a method of washing polycrystalline silicon including: a first washing step of bringing fluonitric acid into contact with polycrystalline silicon; and a second washing step of bringing a non-oxidizing chemical containing hydrofluoric acid into contact with the polycrystalline silicon that has undergone the first washing step.

In order to solve the above problem, a device for washing polycrystalline silicon, including: a first washing section that brings fluonitric acid into contact with polycrystalline silicon; and a second washing section that brings a non-oxidizing chemical containing hydrofluoric acid into contact with the polycrystalline silicon that has undergone treatment by the first washing section.

Advantageous Effects of Invention

An aspect of the present invention brings about the effects of making it possible to both (i) remove a contaminant on the surface of polycrystalline silicon, and (ii) produce highly-pure polycrystalline silicon, with only a small amount of etching.

DESCRIPTION OF EMBODIMENTS

Figure 1:
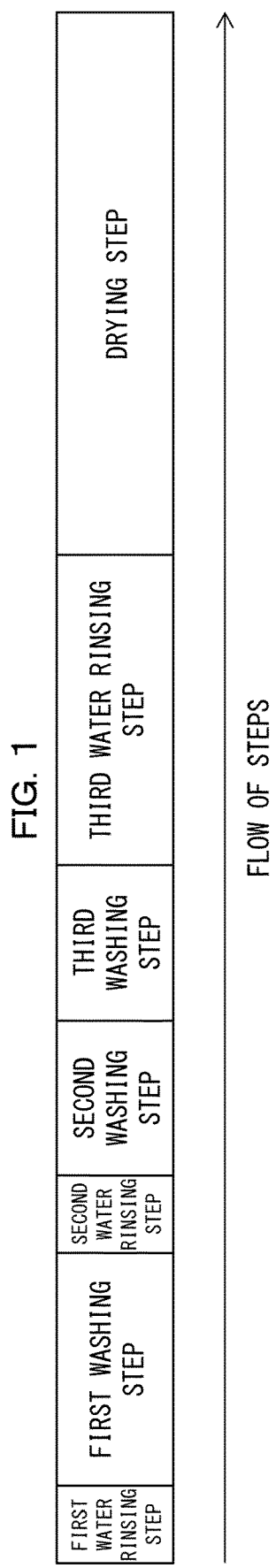
FIG. 1 is a block diagram of a washing method according to an example of the present invention.

The following description will discuss embodiments of the present invention in detail. Note that, herein, the phrase "A to B" refers to a numerical range that is "not less than A and not more than B (i.e., a range from A to B including both A and B)" unless stated otherwise.

1. Method of Producing Polycrystalline Silicon

A method of producing a polycrystalline silicon to be washed is not particularly limited. Possible examples of such a method encompass a method involving a silicon depositing step in which a chlorosilane compound and hydrogen are reacted in a reactor so as to deposit polycrystalline silicon. The Siemens process is known as a method for depositing silicon. In the Siemens process, trichlorosilane and hydrogen are reacted in a bell-shaped (bell-jar) reactor. Then, polycrystalline silicon is deposited on the surface of a core rod for polycrystalline silicon deposition, which core rod is provided inside the reactor, and a grown polycrystalline silicon rod is obtained.

The method of producing the polycrystalline silicon may include a step of crushing the polycrystalline silicon rod obtained from the silicon depositing step, and a step of classifying the crushed polycrystalline silicon.

The method of producing the polycrystalline silicon in accordance with an embodiment of the present invention includes a polycrystalline silicon washing method, described later, as one step. For example, the crushed polycrystalline silicon or the classified polycrystalline silicon is washed by the washing method described later. This makes it possible to obtain highly-pure polycrystalline silicon.

2. Method of Washing Polycrystalline Silicon

Hereinafter, a method of washing polycrystalline silicon in accordance with an embodiment of the present invention includes: a first washing step of bringing fluonitric acid into contact with polycrystalline silicon; and a second washing step of bringing a non-oxidizing chemical containing hydrofluoric acid into contact with the polycrystalline silicon that has undergone the first washing step.

2-1. First Washing Step

In the first washing step, fluonitric acid is brought into contact with the polycrystalline silicon. Herein, the term "fluonitric acid" refers to an aqueous solution in which nitric acid and hydrogen fluoride are mixed. The fluonitric acid preferably contains the nitric acid in an amount of 40% by mass to 70% by mass and the hydrogen fluoride in an amount of 0.1% by mass to 3.0% by mass. The fluonitric acid more preferably contains the nitric acid in an amount of 50% by mass to 70% by mass and the hydrogen fluoride in an amount of 0.2% by mass to 2.5% by mass.

On the polycrystalline silicon taken out of the reactor described above, an oxide layer containing a contaminant can usually be formed, by natural oxidation, to a thickness of several nanometers. Bringing this polycrystalline silicon into contact with the fluonitric acid causes a reaction as follows. Mainly due to the action of the hydrogen fluoride, the surface of the polycrystalline silicon is etched and the oxide layer present on the surface is removed. Mainly due to the action of the nitric acid, a new oxide layer is formed on the surface of the polycrystalline silicon. Simultaneous progression of (i) the removal of the oxide layer and (ii) formation of the new oxide layer causes the polycrystalline silicon to be etched, such that the contaminant adhered to the surface of the polycrystalline silicon and the contaminant incorporated in the polycrystalline silicon is removed. The contaminant includes e.g. organic substances, metal, and resin.

Examples of main metals that can be contaminants or impurities encompass Na, Mg, Al, K, Ca, Cr, Fe, Ni, Co, Cu, Zn, and W.

Note that possible mechanisms by which the contaminant is incorporated into the polycrystalline silicon include the following. (1) The contaminant is incorporated into the polycrystalline silicon by the formation of an oxide layer in a state where the contaminant is adhered to the surface of the polycrystalline silicon. (2) The contaminant present on surface of the polycrystalline silicon is pushed into the polycrystalline silicon by pressure acting on the contaminant. Examples of causes of such pressure encompass crushing the polycrystalline silicon with use of e.g. a hammer, and classifying the polycrystalline silicon with use of e.g. a sieve.

Because the removed contaminant is present in the fluonitric acid, a portion of the removed contaminant can be incorporated into an oxide layer of the polycrystalline silicon when the oxide layer is formed by the action of the nitric acid. Replacing the used chemical with a new chemical makes it possible to reduce the amount of contaminant incorporated into this oxide layer. However, replacing the chemical may increase the amount of the chemical used for washing.

Therefore, in consideration of the amount of the chemical used and washing efficiency, in the first washing step, the chemical brought into contact with the polycrystalline silicon is preferably replaced 1 to 5 times, and more preferably replaced 2 or 3 times. Furthermore, at the same time as replacing the chemical, the concentration of the nitric acid and the hydrogen fluoride relative to the fluonitric acid may be changed.

The method of bringing the fluonitric acid into contact with the polycrystalline silicon is typically carried out at normal pressure and at a liquid temperature of not less than 10° C. The liquid temperature of the fluonitric acid is preferably 10° C. to 35° C., and more preferably 15° C. to 30° C., in terms of increasing the ability to remove the oxide layer present on the surface of the polycrystalline silicon, and controlling the removed thickness of a silicon layer including the oxide layer.

Examples of specific methods for bringing the fluonitric acid into contact with the polycrystalline silicon encompass: a method of immersing a washing basket containing the polycrystalline silicon into a washing bath filled with the fluonitric acid; and a method of dispersing the fluonitric acid onto the polycrystalline silicon by use of e.g. a shower. Out of these, the method of immersing the washing basket containing the polycrystalline silicon in the washing bath filled with the fluonitric acid is preferable in terms of washing efficiency. In the first washing step, if the chemical is replaced a plurality of times, the fluonitric acid may be added to and removed from the same washing bath a plurality of times. However, from in terms of efficiency of operation, it is preferable that a plurality of washing baths, each filled with the fluonitric acid, are provided in parallel, and the washing basket containing the polycrystalline silicon is immersed in the plurality of the washing baths in sequence.

In order to prevent the contaminant from remaining, it is preferable that the fluonitric acid is brought into contact with the entire surface of the polycrystalline silicon as uniformly as possible. Examples of such a contact method encompass a method in which the fluonitric acid is brought into contact with the polycrystalline silicon while the polycrystalline silicon is being oscillated. The method of oscillation is not particularly limited. Possible examples encompass, for example, an up and down movement and a swinging movement.

In terms of making the surface of the polycrystalline silicon that has undergone the first washing step as clean as possible, it is desirable that the fluonitric acid be as clean as possible. As such, the total amount of a metals selected from Na, Mg, Al, K, Ca, Cr, Fe, Ni, Co, Cu, Zn, and W contained in the fluonitric acid is preferably not more than 1500 ppbw, and more preferably not more than 1000 ppbw, as measured by inductively-coupled plasma mass spectrometry (ICP-MS).

In this first washing step, the amount of etching of the surface of the polycrystalline silicon may be appropriately determined according to e.g. the size and shape of the polycrystalline silicon to be washed. However, in terms of sufficiently removing the oxide layer and highly reducing the metal contamination of the polycrystalline silicon obtained via the washing method in accordance with an embodiment of the present invention, the amount of etching of the surface of the polycrystalline silicon is preferably 1 µm to 15 µm, and more preferably 3 µm to 13 µm. The contact time between the fluonitric acid and the polycrystalline silicon is normally 1 minute to 20 minutes, and preferably 2 minutes to 15 minutes.

2-2. Second Washing Step

In the second washing step, a non-oxidizing chemical containing hydrofluoric acid is brought into contact with the polycrystalline silicon. Herein, "hydrofluoric acid" refers to an aqueous solution of hydrogen fluoride. Furthermore, "non-oxidizing chemical" refers to a chemical which does not oxidize polycrystalline silicon. In other words, the non-oxidizing chemical containing the hydrofluoric acid has a property of removing the oxide layer without forming a new oxide layer. A chemical which contains hydrofluoric acid but oxidizes polycrystalline silicon, i.e., a chemical which forms an oxide layer, is not contained in the non-oxidizing chemical used in the second washing step. The non-oxidizing chemical may consist of hydrofluoric acid. The non-oxidizing chemical may be a chemical obtained in which hydrofluoric acid is mixed with e.g. hydrochloric acid and/or sulfuric acid, which are non-oxidizing acids. Note here that "non-oxidizing acid" refers to an acid in which an ionization product of the acid other than a hydrogen ion does not act as an oxidant. In other words, "non-oxidizing acid" refers to an acid that does not react with metals that have a lower ionization tendency than hydrogen ions.

Washing with only the fluonitric acid may result in a contaminant being incorporated into the oxide layer (normally a thickness of several nanometers) formed by the fluonitric acid. To remove such a contaminant, it is necessary to increase the number of times washing is carried out. In a such case, the amount of the chemical used for washing, and the amount of waste liquid and exhaust gas produced is also increased, and the costs for treating these may be increased. Furthermore, when merely using a combination of (i) washing via hydrofluoric acid and (ii) subsequent washing via fluonitric acid, contaminant which is incorporated into the interior of the polycrystalline silicon may remain. By removing, in the second washing step, the oxide layer that was formed in the first washing step, it is possible to remove the contaminant that was incorporated when the oxide layer was formed in the first washing step. This makes it possible to efficiently remove the contaminant. It is therefore possible to obtain highly-pure polycrystalline silicon while reducing the amount of etching of the polycrystalline silicon.

Note here that if the first washing step is combined with a subsequent step involving contact not with the above non-oxidizing chemical, but rather with an oxidizing chemical, such as ozone water or an aqueous acid solution containing hydrogen peroxide, it will be impossible to sufficiently remove the oxide layer into which the contaminant is incorporated. Furthermore, if the chemical used for the first washing step in instead used in the second washing step and vice versa, there will be an insufficient cleaning effect on the surface of the polycrystalline silicon.

The non-oxidizing chemical contains the hydrogen fluoride in an amount of preferably 1% by mass to 10% by mass, and more preferably 1% by mass to 6% by mass. If the concentration of the hydrogen fluoride is greater than or equal to 1% by mass, the oxide layer can be sufficiently removed. If the concentration of the hydrogen fluoride is less than or equal to 10% by mass, it is easy to control the rate at which the non-oxidizing chemical and the polycrystalline silicon react. A hydrogen fluoride concentration of not more than 10% by mass also makes it possible to reduce costs. If the non-oxidizing chemical is a chemical in which hydrofluoric acid is mixed with a non-oxidizing acid, the amount of the non-oxidizing acid is preferably 0.5% by mass to 10% by mass, and more preferably 1% by mass to 6% by mass.

Note that, because the above washing method can efficiently remove the contaminant by combining the first washing step and the second washing step, the concentration of the hydrogen fluoride may be lower than that of a washing method using only hydrofluoric acid. In other words, the above washing method makes it possible to sufficiently remove the contaminant even if the concentration of the hydrogen fluoride is less than 10% by mass.

In the second washing step of bringing the non-oxidizing chemical into contact with the polycrystalline silicon, because no oxide layer is newly formed on the surface of the polycrystalline silicon, a contaminant cannot in principle be incorporated into an oxide layer. However, the non-oxidizing chemical does re-adhere to the surface of the polycrystalline silicon to some extent. As such, contaminant that has been removed once may re-contaminate the polycrystalline silicon. Accordingly, it is preferable to replace the used chemical with new chemical to ameliorate the problem of the non-oxidizing chemical re-adhering thusly. Therefore, in consideration of the amount of the chemical used and washing efficiency, in the second washing step as well, the chemical brought into contact with the polycrystalline silicon is preferably to replaced 1 to 5 times, and more preferably replaced 2 or 3 times. Furthermore, at the same time as replacing the chemical, the concentration of the hydrogen fluoride and the non-oxidizing acid may be changed.

The method of bringing the non-oxidizing chemical into contact with the polycrystalline silicon is typically carried out at normal pressure and at a liquid temperature of not less than 10° C. The liquid temperature of the non-oxidizing chemical containing the hydrofluoric acid is preferably 10° C. to 50° C., and more preferably 15° C. to 40° C., in terms of increasing the ability to remove the oxide layer present on the surface of the polycrystalline silicon.

As a specific method of bringing the non-oxidizing chemical into contact with the polycrystalline silicon, it is possible to use a method similar to the method of bringing the fluonitric acid into contact with the polycrystalline silicon in the first washing step as described above. Furthermore, it is preferable that the second washing step is carried out a plurality of times while replacing the chemical in the same manner as in the first washing step.

In terms of making the surface of the polycrystalline silicon that has undergone the second washing step as clean as possible, it is desirable that the non-oxidizing chemical be as clean as possible. As such, the total amount of a metals selected from Na, Mg, Al, K, Ca, Cr, Fe, Ni, Co, Cu, Zn, and W contained in the non-oxidizing chemical is preferably not more than 500 pptw, and more preferably not more than 100 pptw, as measured by inductively-coupled plasma mass spectrometry (ICP-MS).

This second washing step need only be carried out to a degree such that the oxide layer formed on the surface of the polycrystalline silicon can be sufficiently removed. When expressed in terms of the time of contact with the non-oxidizing chemical, the second washing step is normally 1 minute to 15 minutes, and preferably 2 minutes to 10 minutes.

2-3. Third Washing Step

The method of washing polycrystalline silicon preferably includes a third washing step in which an oxide layer is formed on the surface of the polycrystalline silicon that has undergone the second washing step.

When the polycrystalline silicon from which the oxide layer was removed in the second washing step is exposed to the atmosphere, an oxide layer can grow slowly thereon. The oxide layer gradually formed in the atmosphere may be formed unevenly on the surface of the polycrystalline silicon. This can cause a contaminant to be incorporated in some cases. Therefore, by forming an oxide layer having a desired thickness (normally a thickness of several nanometers) in the third washing step, it is possible to better reduce the incorporation of contaminants in the atmosphere. Note that since contaminants have already been removed to a considerable degree by the first washing step and the second washing step, there is almost no risk that a contaminant will remain in the oxide layer formed in the third washing step.

Examples of a method of forming an oxide layer in the third washing step encompass (i) a method of bringing fluonitric acid into contact with the polycrystalline silicon, (ii) a treatment involving bringing ozone water into contact with the polycrystalline silicon, and (iii) a method of bringing an aqueous acid solution containing hydrogen peroxide into contact with the polycrystalline silicon. Out of these, the method of bringing fluonitric acid into contact with the polycrystalline silicon is preferable because it can be carried out with a device configured similarly to that used in the first washing step and the second washing step, so that no special equipment is required. Further, the method of bringing fluonitric acid into contact with the polycrystalline silicon is preferable because it is possible to adjust the rate at which the oxide layer is formed (the balance between forming and removing the oxide layer) and the thickness of the oxide layer by changing (i) the duration of time that the polycrystalline silicon and the fluonitric acid are in contact and (ii) the concentration of the fluonitric acid.

Similarly to the first washing step and the second washing step, the third washing step may involve replacing the chemical used in the third washing step a plurality of times, specifically 1 to 5 times, and more preferably 2 or 3 times. At the same time as replacing the chemical, the concentration of the components of the chemical used in the third washing step may be changed.

The third washing step is typically carried out at normal pressure, with the chemical having a liquid temperature of not less than 10° C. As in the case of the first washing step, if the third washing step is a method of bringing fluonitric acid into contact with the polycrystalline silicon, the liquid temperature of the chemical is preferably 10° C. to 35° C., and more preferably 15° C. to 30° C.

If the third washing step is a method of bringing fluonitric acid into contact with the polycrystalline silicon, the details thereof may be the same as those of the first washing step. Because the purpose of the third washing step is for the nitric acid in the fluonitric acid to act to form an oxide layer on the surface of the polycrystalline silicon, the concentration of the nitric acid is preferably a high concentration of 40% by mass to 70% by mass, as in the case of the first washing step. However, since etching normally need only be carried out in a supplemental manner to the first washing step, the hydrogen fluoride concentration does not need to be set as high as in the first washing step, and is preferably 0.05% by mass to 1.5% by mass. In terms of (i) sufficiently forming the oxide layer and (ii) adjusting the amount of etching, the fluonitric acid more preferably (a) contains nitric acid in an amount of 50% by mass to 70% by mass, and (b) contains hydrogen fluoride in an amount of 0.1% by mass to 1.0% by mass.

The amount of etching of the surface of the polycrystalline silicon in the third washing step is preferably 0.1 μm to 3 μm, and more preferably 0.1 μm to 2 μm, in order to supplementarily adjust the e.g. the size and shape of the polycrystalline silicon that has undergone the first washing step, as well as the amount of contaminants such as metal contained therein. The contact time in the third washing step is normally 1 minutes to 15 minutes, and preferably 2 minutes to 10 minutes.

2-4. Other Steps

The method of washing polycrystalline silicon may further include a preliminary washing step carried out prior to the first washing step. The preliminary washing step preferably utilizes a non-oxidizing chemical containing hydrofluoric acid. Carrying out preliminary washing using a non-oxidizing chemical containing hydrofluoric acid makes it possible to remove the contaminant incorporated into the surface of the polycrystalline silicon. In particular, such a preliminary washing makes it possible to remove in advance the contaminant contained in a natural oxide layer formed on the surface prior to the first washing step. This makes it easier to produce purer polycrystalline silicon. Conditions for washing with use of the non-oxidizing chemical containing the hydrofluoric acid in the preliminary washing step are similar to those of the second washing step.

A method of washing polycrystalline silicon in an embodiment of the present invention may further include a drying step.

Specifically, the method of washing polycrystalline silicon may include, as a final step, a drying step of drying the polycrystalline silicon. Such a step makes it possible to remove water adhering to the surface of the polycrystalline silicon. Examples of methods for drying encompass natural drying, through-flow drying, heat drying, and reduced-pressure drying. The drying method may involve a plurality of drying methods in combination. Cooling may be carried out along with drying.

The method of washing polycrystalline silicon may include a water rinsing step prior to the first washing step, between washing steps, and/or prior to the drying step. Including the water rinsing step makes it possible to prevent or reduce the chemical being brought into the next step and to remove contaminant adhering to the surface of the polycrystalline silicon. However, if rinsing with water is carried out, moisture will be brought into the next step, and the concentration of the fluonitric acid or the hydrofluoric acid relative to the chemical will be lowered. This may cause a decrease in the ability to remove the contaminant by the chemical. From this viewpoint, the water rinsing step may be omitted. Water used in the washing steps is preferably purified water containing little contaminant, and is more preferably ultrapure water.

3. Polycrystalline Silicon Washing Device

A polycrystalline silicon washing device includes: a first washing section that brings fluonitric acid into contact with polycrystalline silicon; and a second washing section that brings a non-oxidizing chemical containing hydrofluoric acid into contact with the polycrystalline silicon that has undergone treatment by the first washing section.

3-1. First Washing Section

In the first washing section, the fluonitric acid is brought into contact with the polycrystalline silicon. In the first washing section, it is preferable that the fluonitric acid uniformly contacts the polycrystalline silicon. The first washing section may include, for example, a basket that accommodates the polycrystalline silicon and a washing bath containing fluonitric acid. The first washing section may include a shower for dispersing the fluonitric acid. Components of the first washing section are preferably made of a material which is not corroded by the fluonitric acid and does not contaminate the polycrystalline silicon. These components are preferably made of a resin such as polyvinyl chloride, polypropylene, polyethylene, polytetrafluoroethylene, and polyvinylidene fluoride.

3-2. Second Washing Section

In the second washing section, a non-oxidizing chemical containing hydrofluoric acid is brought into contact with the polycrystalline silicon that has been washed by the first washing section. In the second washing section, it is preferable that the non-oxidizing chemical containing the hydrofluoric acid uniformly contacts the polycrystalline silicon. The second washing section may include, for example, a basket that accommodates the polycrystalline silicon and a washing bath containing the non-oxidizing chemical. The second washing section may include a shower for dispersing the non-oxidizing chemical. Components of the second washing section are preferably made of a material which is not corroded by the non-oxidizing chemical containing the hydrofluoric acid and does not contaminate the polycrystalline silicon. These components are preferably made of a resin such as polyvinyl chloride, polypropylene, polyethylene, polytetrafluoroethylene, and polyvinylidene fluoride.

3-3. Third Washing Section

In addition to the first washing section and the second washing section, the device for washing polycrystalline silicon preferably includes a third washing section after the second washing section. In the third washing section, fluonitric acid is brought into contact with the polycrystalline silicon that has been washed by the second washing section. In the third washing section, it is preferable that the fluonitric acid uniformly contacts the polycrystalline silicon and forms a substantially uniform oxide layer. The third washing section may include e.g. a basket, a washing bath, and/or a shower, similarly to the first washing section. Components of the third washing section are preferably made of a material which is not corroded by the fluonitric acid and does not contaminate the polycrystalline silicon. These components are preferably made of a resin such as polyvinyl chloride, polypropylene, polyethylene, polytetrafluoroethylene, and polyvinylidene fluoride.

3-4. Other Components

The device for washing polycrystalline silicon may include a preliminary washing section, and may further include a water rinsing section, a drying section, and/or a cooling section.

The preliminary washing section is provided before the first washing section. In an embodiment of the present invention, the polycrystalline silicon to be subjected to washing is brought into contact with a preliminary washing chemical in advance. In the preliminary washing section, it is preferable that the preliminary washing chemical uniformly contacts the polycrystalline silicon. The pre-washing chemical is preferably a non-oxidizing chemical containing hydrofluoric acid. In a case where the preliminary washing chemical is a non-oxidizing chemical containing hydrofluoric acid, it is preferable that the details of the washing structure be similar to those of the second washing section.

The water rinsing section is provided as appropriate before the first washing section, between the respective washing sections, and/or before the drying section, and prevents or reduces the chemical being brought into the next step. The water rinsing section may, for example, include a basket that accommodates the polycrystalline silicon and a washing bath containing pure water or ultrapure water. The water rinsing section may include a shower for dispersing pure water or ultrapure water.

The drying section is provided for removing e.g. water after washing of the polycrystalline silicon has finished. The drying section can be a known drying device. A plurality of drying devices can be used in combination as the drying section. The cooling section can be a known cooling device. A plurality of cooling devices can be used in combination as the cooling section. For example, the drying section and the cooling section may each include a basket that accommodates the polycrystalline silicon, and may each include a conveyor that conveys the polycrystalline silicon.

The present invention is not limited to the embodiments, but can be altered in various ways within the scope of the claims. The present invention also encompasses, in its technical scope, any embodiment derived by combining technical means disclosed in differing embodiments.

EXAMPLES

The following description will discuss the present invention in more detail based on Examples, but the present invention is not limited to these Examples.

Example 1

Example 1-1

FIG. 1 is a block diagram of a washing method according to the present Example. In the present Example, the following steps were carried out: a first water rinsing step, a first washing step, a second water rinsing step, a second washing step, a third washing step, a third water rinsing step, and a drying step. In each water rinsing step and washing step, the polycrystalline silicon, placed in a washing basket, was immersed in a washing bath filled with the liquid used in that step.

Used in the first water rinsing step was polycrystalline silicon which had been taken out of a bell jar and had been shaped with use of e.g. a hammer to be in a clumped shape having (i) a long axis of not less than 20 mm and not more than 90 mm and (ii) a short axis of not less than 10 mm and not more than 60 mm. In the first water rinsing step, this polycrystalline silicon was put into a polypropylene washing basket, and then brought into contact with pure water (liquid temperature: 20° C.) for 3 minutes.

As a first washing step, the polycrystalline silicon that had undergone the first water rinsing step was brought into contact with fluonitric acid (liquid temperature: 20° C.). The amount of nitric acid contained in the fluonitric acid was 69% by mass, and the amount of the hydrogen fluoride contained in the fluonitric acid was 0.2% by mass. The total amount of metals selected from Na, Mg, Al, K, Ca, Cr, Fe, Ni, Co, Cu, Zn, and W contained in the fluonitric acid was 400 ppbw, as measured by the inductively-coupled plasma mass spectrometry (ICP-MS). The entire surface of the polycrystalline silicon was brought into contact the fluonitric acid for 9 minutes while the washing basket was oscillated. In the first washing step, "the amount of etching of the polycrystalline silicon" in the first washing step was measured by the measurement method described later.

As the second water rinsing step, the polycrystalline silicon that had undergone the first washing step was rinsed with ultrapure water (liquid temperature: 20° C.). Carrying out water rinsing prior to the second washing step makes it possible to prevent fluonitric acid and particularly the nitric acid used in the first washing step from contaminating the second washing step.

As the second washing step, the polycrystalline silicon that had undergone the second water rinsing step was brought into contact with a non-oxidizing chemical (liquid temperature: 20° C.) containing hydrofluoric acid. An aqueous solution containing only the hydrogen fluoride was used as the non-oxidizing chemical. The hydrogen fluoride was contained in the non-oxidizing chemical in an amount of 5% by mass. The total amount of metals selected from Na, Mg, Al, K, Ca, Cr, Fe, Ni, Co, Cu, Zn, and W contained in the non-oxidizing chemical was 50 pptw, as measured by inductively-coupled plasma mass spectrometry (ICP-MS).

The polycrystalline silicon was brought into contact with the non-oxidizing chemical for 6 minutes while the washing basket was oscillated.

As the third washing step, the polycrystalline silicon that had undergone the second washing step was brought into contact with fluonitric acid (liquid temperature: 20° C.), without first rinsing the polycrystalline silicon with water. In the third washing step, the amount of nitric acid contained in the fluonitric acid was 69% by mass, and the amount of the hydrogen fluoride contained in the fluonitric acid was 0.2% by mass. The amount of metal contained in this fluonitric acid was the same as in the fluonitric acid used in the above-described first washing step. The entire surface of the polycrystalline silicon was brought into contact with the fluonitric acid for 6 minutes while the washing basket was oscillated, so as to form an oxide layer on the surface of the polycrystalline silicon. In this third washing step, "the amount of etching of the polycrystalline silicon" in this step was measured by the measurement method described later.

As the third water rinsing step, the polycrystalline silicon that had undergone the third washing step was rinsed with ultrapure water. As a drying step, the polycrystalline silicon was subjected to through-flow drying and subsequently subjected to through-flow cooling.

The "metal surface cleanliness" of the cooled polycrystalline silicon was measured by the measurement method described later. Note here that the "metal surface cleanliness" refers to the amount of metal elements that adhere to or have been pressed into the surface of the polycrystalline silicon, and "Fe surface cleanliness" refers to the amount of iron that adheres to or has been pressed into the surface of the polycrystalline silicon.

Examples 1-2 to 1-5

Polycrystalline silicon washing was carried out using steps similar to those of Example 1-1, except that in the first and third washing steps, the amount of nitric acid and amount of hydrogen fluoride contained in the fluonitric acid was changed to the amounts shown in Table 1. These examples were referred to as Examples 1-2 to 1-5.

Example 2

In the washing method of Example 2, ultrapure water was used in the first water rinsing step, and between the first water rinsing step and the first washing step, hydrofluoric acid containing 1% by mass of hydrogen fluoride was brought into contact with the polycrystalline silicon for 3 minutes while oscillating the washing basket. From the first washing step onward, washing was carried out via a method similar to Example 1. In the first and third washing steps, the amount of the nitric acid and the amount of the hydrogen fluoride contained in the fluonitric acid was set as indicated in the two conditions shown in Table 1. These examples were referred to as Examples 2-1 and 2-2.

Example 3

In the washing method of Example 3, washing was carried out via a method similar to Example 1, except that (i) pure water was used in the first water rinsing step, and (ii) the third washing step was omitted. In the first washing step, the amount of the nitric acid and the amount of the hydrogen fluoride contained in the fluonitric acid was set as indicated in the three conditions shown in Table 1. These examples were referred to as Examples 3-1 to 3-3.

Comparative Example 1

In the washing method of Comparative Example 1, after the first water rinsing step described in Example 1 was carried out, as a first washing step, fluonitric acid was brought into contact with the polycrystalline silicon for 9 minutes, while oscillating the polycrystalline silicon. Then, immediately after the first washing step, the third water rinsing step and the drying step were carried out. In other words, in Comparative Example 1, the second washing step was omitted. In the first washing step, the amount of the nitric acid and the amount of the hydrogen fluoride contained in the fluonitric acid was set as indicated in the five conditions shown in Table 1. These examples were referred to as Comparative Examples 1-1 to 1-5.

Comparative Example 2

In the washing method of Comparative Example 2, between the first water rinsing step and the first washing step, hydrofluoric acid containing 1% by mass of the hydrogen fluoride was brought into contact with the polycrystalline silicon for 3 minutes, while oscillating the polycrystalline silicon. From the first washing step onward, washing was carried out via a method similar to Comparative Example 1. In other words, in Comparative Example 2 as well, the second washing step was omitted. In the first washing step, the amount of the nitric acid and the amount of the hydrogen fluoride contained in the fluonitric acid was set as indicated in the five conditions shown in Table 1. These examples were referred to as Comparative Examples 2-1 to 2-5.

Method of Evaluating Washing Methods

The amount of etching and the Fe surface cleanliness of were evaluated for the respective washing methods in each Example and Comparative Example. Evaluations were carried out with use of the polycrystalline silicon adjusted to have the desired size as described above. The Fe surface cleanliness (pptw) was used to evaluate the amount of iron adhering to the surface of the polycrystalline silicon.

Amount of Etching of Polycrystalline Silicon in First and Third Washing Steps

As a sample for measuring the amount of etching, a group of small pieces of polycrystalline silicon was used, the pieces having a cubic shape with each side measuring approximately 7 mm. The first and third washing steps were each carried out such that each washing bath contained the group of small pieces of the polycrystalline silicon (120 pieces) together with the polycrystalline silicon to be washed. The group of small pieces of polycrystalline silicon were exposed to the same etching environment as the polycrystalline silicon to be washed. Before each washing step was carried out, the total weight of the group of small pieces of the polycrystalline silicon (120 pieces) was measured with use of an electronic scale. After each washing step was completed, the total weight of the group of small pieces of polysilicon which had been taken out from the washing bath and dried was measured. An etching thickness (µm) in each washing step was calculated from (i) the weight change of the group of small pieces of the polycrystalline silicon observed after the washing and (ii) the total surface area of the group of small pieces of the polycrystalline silicon as observed prior to that washing step. This etching thickness was considered to be the amount of etching.

Fe Surface Cleanliness

In 50 ml of fluonitric acid (nitric acid content: 65% by mass; hydrogen fluoride content: 5% by mass; liquid temperature: 20° C.), 90 g of polycrystalline silicon was immersed for 15 minutes, and the surface of the polycrystalline silicon was decomposed and removed to obtain an extraction liquid. The various metallic elements in the obtained extraction liquid were analyzed by inductively-coupled plasma mass spectrometry (ICP-MS), and the measured values were divided by 90 g, to find a contained amount per weight of the polycrystalline silicon (pptw).

Results

Figure 2:
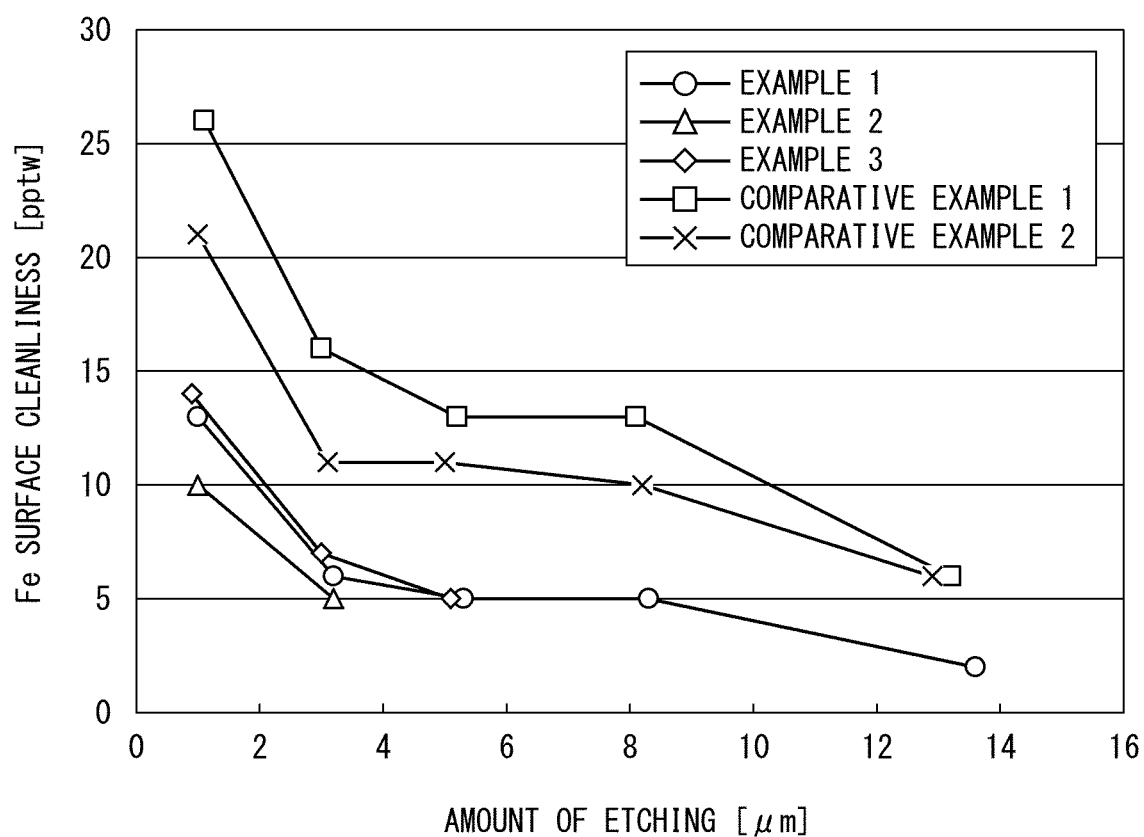
FIG. 2 is a diagram illustrating a relation between (i) the amount of etching and (ii) an iron surface cleanliness of polycrystalline silicon, according to examples of the present invention.

The amount of etching observed for each of the conditions used is shown in Table 1. FIG. 2 is a graph indicating the relation between the Fe surface cleanliness and the amount of etching of the polycrystalline silicon washed by the washing methods of Example 1, Example 2, Example 3, Comparative Example 1, and Comparative Example 2. Detailed metal surface cleanliness is indicated in Table 2.

The metal surface cleanliness for metals other than iron was measured in the same manner as for iron. Table 2 also indicates detailed metal surface cleanliness of a control in which washing was not carried out.

required to achieve an Fe surface cleanliness of less than or equal to 5 pptw. In Comparative Example 2, etching exceeding approximately 13 μm was required to achieve an Fe surface cleanliness of less than or equal to 5 pptw.

TABLE 1

| | Chemical concentration (wt %) | | | | Amount of etching (μm) | |
|---|---|---|---|---|---|---|
| | First washing | | Third washing | | | |
| | HNO₃ | HF | HNO₃ | HF | First washing | Third washing |
| Control | 0 | 0 | 0 | 0 | 0 | 0 |
| Example 1-1 | 69 | 0.2 | 69 | 0.1 | 0.8 | 0.2 |
| Example 1-2 | 68 | 0.7 | 69 | 0.2 | 2.7 | 0.5 |
| Example 1-3 | 68 | 1 | 69 | 0.4 | 4.3 | 1.0 |
| Example 1-4 | 67 | 1.4 | 69 | 0.4 | 7.2 | 1.1 |
| Example 1-5 | 67 | 2 | 68 | 1 | 11.3 | 2.3 |
| Example 2-1 | 69 | 0.2 | 69 | 0.1 | 0.8 | 0.2 |
| Example 2-2 | 68 | 0.7 | 69 | 0.2 | 2.7 | 0.5 |
| Example 3-1 | 69 | 0.2 | — | — | 0.9 | — |
| Example 3-2 | 68 | 0.7 | — | — | 3 | — |
| Example 3-3 | 68 | 1 | — | — | 5.1 | — |
| Comparative Example 1-1 | 69 | 0.2 | — | — | 1.1 | — |
| Comparative Example 1-2 | 68 | 0.7 | — | — | 3 | — |
| Comparative Example 1-3 | 68 | 1 | — | — | 5.2 | — |
| Comparative Example 1-4 | 67 | 1.5 | — | — | 8.1 | — |
| Comparative Example 1-5 | 67 | 2 | — | — | 13.2 | — |
| Comparative Example 2-1 | 69 | 0.2 | — | — | 1 | — |
| Comparative Example 2-2 | 68 | 0.7 | — | — | 3.1 | — |
| Comparative Example 2-3 | 68 | 1 | — | — | 5 | — |
| Comparative Example 2-4 | 67 | 1.5 | — | — | 8.2 | — |
| Comparative Example 2-5 | 67 | 2 | — | — | 12.9 | — |

TABLE 2

| | Metal surface cleanliness (pptw) | | | | | | | | | | | | |
|---|---|---|---|---|---|---|---|---|---|---|---|---|---|
| | Na | Mg | Al | K | Ca | Cr | Fe | Ni | Co | Cu | Zn | W | Total |
| Control | 159 | 138 | 234 | 124 | 4435 | 45 | 378 | 27 | 135 | 6 | 692 | 427 | 6800 |
| Example 1-1 | 7 | 5 | 5 | 1 | 15 | 2 | 13 | 1 | 0 | 1 | 8 | 75 | 133 |
| Example 1-2 | 2 | 2 | 2 | 1 | 14 | 1 | 6 | 0 | 0 | 1 | 4 | 18 | 51 |
| Example 1-3 | 1 | 2 | 2 | 2 | 12 | 1 | 5 | 0 | 0 | 0 | 3 | 11 | 39 |
| Example 1-4 | 3 | 2 | 2 | 1 | 9 | 1 | 5 | 1 | 0 | 0 | 3 | 9 | 36 |
| Example 1-5 | 2 | 1 | 1 | 1 | 5 | 0 | 2 | 0 | 0 | 0 | 1 | 3 | 16 |
| Example 2-1 | 2 | 2 | 3 | 1 | 10 | 2 | 10 | 1 | 0 | 0 | 4 | 35 | 70 |
| Example 2-2 | 1 | 1 | 2 | 1 | 8 | 1 | 5 | 0 | 0 | 1 | 3 | 15 | 37 |
| Example 3-1 | 8 | 6 | 5 | 2 | 18 | 2 | 14 | 2 | 0 | 1 | 9 | 114 | 181 |
| Example 3-2 | 3 | 3 | 3 | 1 | 16 | 1 | 7 | 1 | 0 | 1 | 5 | 22 | 63 |
| Example 3-3 | 3 | 3 | 2 | 1 | 15 | 1 | 5 | 1 | 0 | 1 | 4 | 13 | 49 |
| Comparative Example 1-1 | 25 | 8 | 8 | 16 | 44 | 4 | 26 | 3 | 1 | 1 | 29 | 106 | 271 |
| Comparative Example 1-2 | 15 | 4 | 4 | 8 | 44 | 3 | 16 | 2 | 0 | 2 | 28 | 33 | 159 |
| Comparative Example 1-3 | 10 | 2 | 3 | 3 | 39 | 1 | 13 | 1 | 0 | 0 | 14 | 14 | 100 |
| Comparative Example 1-4 | 10 | 3 | 2 | 2 | 33 | 2 | 13 | 1 | 0 | 0 | 13 | 16 | 95 |
| Comparative Example 1-5 | 3 | 1 | 1 | 1 | 20 | 1 | 6 | 1 | 0 | 0 | 7 | 8 | 49 |
| Comparative Example 2-1 | 10 | 5 | 4 | 2 | 33 | 4 | 21 | 2 | 1 | 1 | 7 | 110 | 200 |
| Comparative Example 2-2 | 10 | 3 | 4 | 2 | 24 | 2 | 11 | 1 | 0 | 0 | 5 | 21 | 83 |
| Comparative Example 2-3 | 10 | 3 | 3 | 2 | 26 | 1 | 11 | 1 | 0 | 1 | 7 | 13 | 78 |
| Comparative Example 2-4 | 9 | 3 | 3 | 2 | 26 | 1 | 10 | 1 | 0 | 1 | 7 | 12 | 75 |
| Comparative Example 2-5 | 2 | 1 | 0 | 1 | 12 | 1 | 6 | 0 | 0 | 0 | 3 | 4 | 31 |

In Example 1, etching of approximately 5 μm was required in order to achieve both (i) a Fe surface cleanliness of less than or equal to 5 pptw, and (ii) a sum of the measured metal surface cleanlinesses which sum was less than or equal to 50 pptw. In Example 2, etching of approximately 3 μm was required to achieve an Fe surface cleanliness of less than or equal to 5 pptw. In Example 3, etching of approximately 5 μm was required to achieve an Fe surface cleanliness of less than or equal to 5 pptw. In Comparative Example 1, etching exceeding approximately 13 μm was From Table 1, it can be seen that in Examples 1, 2, and 3, it is possible to reduce, with a small amount of etching, the metal surface cleanliness for not only iron, which is a typical contaminant, but also for other metals that can be impurities.

SUMMARY

Washing polycrystalline silicon with fluonitric acid, and subsequently with hydrofluoric acid makes it possible to obtain polycrystalline silicon with only a small amount of etching and a small amount of contaminants.

The present invention includes the following.

[1] A method of washing polycrystalline silicon, including: a first washing step of bringing fluonitric acid into contact with polycrystalline silicon; and a second washing step of bringing a non-oxidizing chemical containing hydrofluoric acid into contact with the polycrystalline silicon that has undergone the first washing step.

[2] The method according to [1], further including a third washing step in which an oxide layer is formed on a surface of the polycrystalline silicon that has undergone the second washing step.

[3] The method according to [2], wherein in the third washing step, fluonitric acid is brought into contact with the polycrystalline silicon.

[4] The method according to any one of [1] to [3], wherein the non-oxidizing chemical contains hydrogen fluoride in an amount of 1% by mass to 10% by mass.

[5] A method of producing polycrystalline silicon, including: the method of washing according to any one of [1] to [4] as one step.

[6] A device for washing polycrystalline silicon, including: a first washing section that brings fluonitric acid into contact with polycrystalline silicon; and a second washing section that brings a non-oxidizing chemical containing hydrofluoric acid into contact with the polycrystalline silicon that has undergone treatment by the first washing section.

INDUSTRIAL APPLICABILITY

An embodiment of the present invention can be applied to washing and production of polycrystalline silicon.

The invention claimed is:

1. A method of washing polycrystalline silicon, comprising:
a first washing step of bringing fluonitric acid into contact with polycrystalline silicon;
a second washing step of bringing a non-oxidizing chemical solution containing hydrofluoric acid into contact with the polycrystalline silicon that has undergone the first washing step; and
a third washing step in which an oxide layer is formed on a surface of the polycrystalline silicon that has undergone the second washing step, wherein in the third washing step, fluonitric acid is brought into contact with the polycrystalline silicon;
wherein the fluonitric acid in the first washing step contains nitric acid in an amount of 50% by mass to 70% by mass and hydrogen fluoride in an amount of 0.1% by mass to 3.0% by mass, and the fluonitric acid in the third washing step contains nitric acid in an amount of 50% by mass to 70% by mass and hydrogen fluoride in an amount of 0.1% by mass to 1.0% by mass.

2. The method according to claim 1, wherein the non-oxidizing chemical solution contains hydrogen fluoride in an amount of 1% by mass to 10% by mass.

3. A method of producing polycrystalline silicon, comprising: a step of washing polycrystalline silicon by the method of washing according to claim 1.

* * * * *